(12) United States Patent
Privat et al.

(10) Patent No.: US 12,727,450 B2
(45) Date of Patent: Sep. 1, 2026

(54) SEMICONDUCTOR DEVICE AND METHOD OF FORMING SACRIFICIAL HETEROEPITAXY INTERFACE TO PROVIDE SUBSTANTIALLY DEFECT-FREE SILICON CARBIDE SUBSTRATE

(71) Applicant: IceMos Technology Limited, Belfast (GB)

(72) Inventors: Aymeric Privat, Tempe, AZ (US); Takeshi Ishiguro, Fukushima (JP); Cathal Duffy, Belfast (GB); Samuel J. Anderson, Tempe, AZ (US)

(73) Assignee: IceMos Technology Limited (GB)

(*) Notice: Subject to any disclaimer, the term of this patent is extended or adjusted under 35 U.S.C. 154(b) by 501 days.

(21) Appl. No.: 17/811,639

(22) Filed: Jul. 11, 2022

(65) Prior Publication Data

US 2023/0061047 A1 Mar. 2, 2023

Related U.S. Application Data

(60) Provisional application No. 63/260,614, filed on Aug. 26, 2021.

(51) Int. Cl.
*H10P 95/00* (2026.01)
*C23C 16/24* (2006.01)
(Continued)

(52) U.S. Cl.
CPC .............. *H10P 95/11* (2026.01); *C23C 16/24* (2013.01); *C30B 25/18* (2013.01); *C30B 29/36* (2013.01);
(Continued)

(58) Field of Classification Search
None
See application file for complete search history.

(56) References Cited

U.S. PATENT DOCUMENTS 6,573,534 B1 6/2003 Kumar et al.
7,846,821 B2 12/2010 Ishiguro et al.
(Continued)

OTHER PUBLICATIONS

SiC Crystallography—https://www.iue.tuwien.ac.at/phd/ayalew/node20.html.

*Primary Examiner* — Julio J Maldonado
*Assistant Examiner* — Pinaki Das
(74) *Attorney, Agent, or Firm* — Robert D. Atkins; PATENT LAW GROUP: Atkins and Associates, P.C.

(57) ABSTRACT

A semiconductor device has a first substrate made of a first semiconductor material, such as silicon. A sacrificial layer is formed over a first surface of the first substrate. A seed layer is formed over the sacrificial layer. A compliant layer is formed over a second surface of the first substrate opposite the first surface of the first substrate. A first semiconductor layer made of a second semiconductor material, such as silicon carbide, dissimilar from the first semiconductor material is formed over the sacrificial layer. The first substrate and sacrificial layer are removed leaving the first semiconductor layer substantially defect-free. The first semiconductor layer containing the second semiconductor material is formed at a temperature greater than a melting point of the first semiconductor material. A second semiconductor layer is formed over the first semiconductor layer with an electrical component formed in the second semiconductor layer.

22 Claims, 19 Drawing Sheets

(51) Int. Cl.

| | |
|---|---|
| ***C30B 25/18*** | (2006.01) |
| ***C30B 29/36*** | (2006.01) |
| ***H10D 30/66*** | (2025.01) |
| ***H10D 62/10*** | (2025.01) |
| ***H10D 62/832*** | (2025.01) |
| ***H10P 14/20*** | (2026.01) |

(52) U.S. Cl.

CPC ........... *H10D 30/66* (2025.01); *H10D 62/111* (2025.01); *H10D 62/8325* (2025.01); *H10P 14/274* (2026.01); *H10P 14/2904* (2026.01); *H10P 14/2905* (2026.01); *H10P 14/2925* (2026.01); *H10P 14/3408* (2026.01)

(56) References Cited

U.S. PATENT DOCUMENTS 7,944,018 B2 5/2011 Anderson et al.
8,114,751 B2 2/2012 Ishiguro et al.
8,129,252 B2 3/2012 Anderson et al.
8,716,829 B2 5/2014 Anderson et al.
8,736,019 B2 5/2014 Anderson et al.
8,963,239 B2 2/2015 Anderson et al.
2002/0008234 A1 1/2002 Emrick et al.
2002/0153594 A1 10/2002 Lipkin et al.
2003/0036247 A1* 2/2003 Eriksen ............. H01L 21/76254 438/455
2003/0151051 A1* 8/2003 Johnson .............. H01L 27/0635 257/77
2004/0009649 A1 1/2004 Kub et al.
2004/0016962 A1 1/2004 Okumura et al.
2004/0150040 A1 8/2004 Nitta et al.
2005/0269660 A1 12/2005 Singh
2006/0169987 A1* 8/2006 Miura ................. H01L 21/0262 257/E21.127
2007/0087525 A1 4/2007 Chen et al.
2008/0142837 A1 6/2008 Sato et al.
2008/0296617 A1* 12/2008 Mishra ............... H10D 62/8503 438/455
2009/0278169 A1 11/2009 Hayashi et al.
2010/0133550 A1 6/2010 Zhang et al.
2010/0327291 A1* 12/2010 Preble ................. H01L 21/0262 257/E29.089
2011/0006310 A1 1/2011 Nagasawa et al.
2011/0220915 A1 9/2011 Edgar et al.
2013/0187224 A1 7/2013 Verma et al.
2014/0264582 A1 9/2014 Anderson et al.
2018/0366569 A1* 12/2018 Zeng .................... H10D 62/393
2019/0165134 A1 5/2019 Diaz et al.
2021/0119039 A1 4/2021 Miida et al.
2022/0293737 A1 9/2022 Han et al.
2023/0120346 A1 4/2023 Ghyselen et al.

* cited by examiner

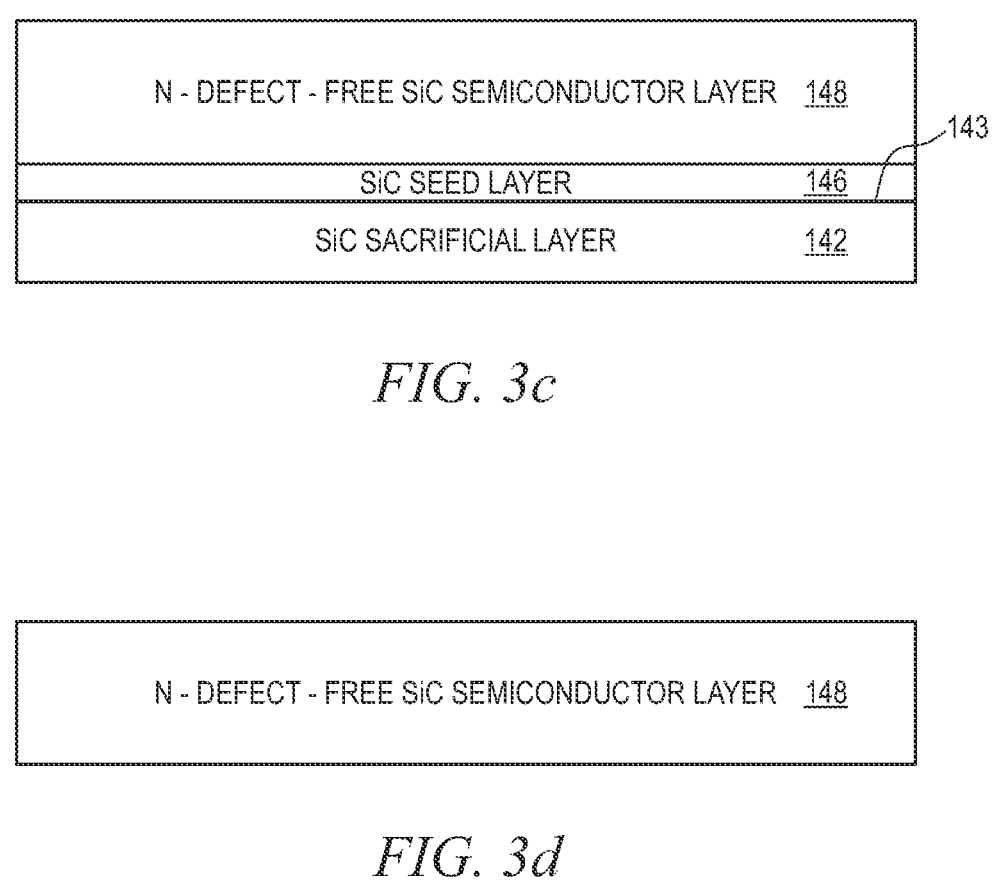

N - DEFECT - FREE SiC SEMICONDUCTOR LAYER 148
143
SiC SEED LAYER 146
SiC SACRIFICIAL LAYER 142

*FIG. 3c*

N - DEFECT - FREE SiC SEMICONDUCTOR LAYER 148

*FIG. 3d*

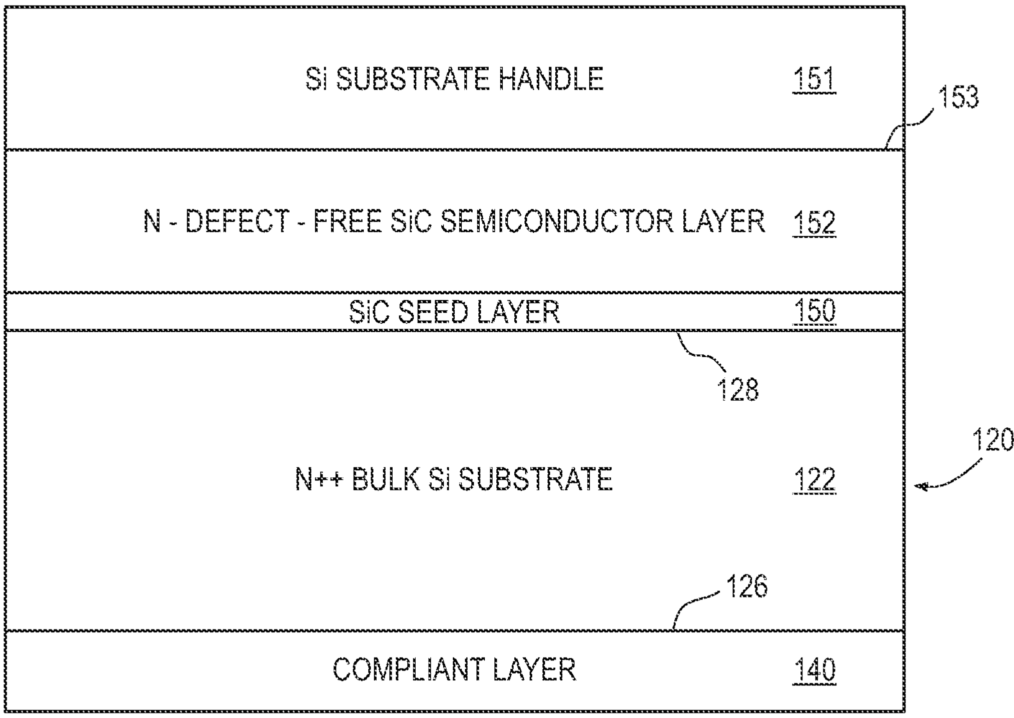
*FIG. 4c*
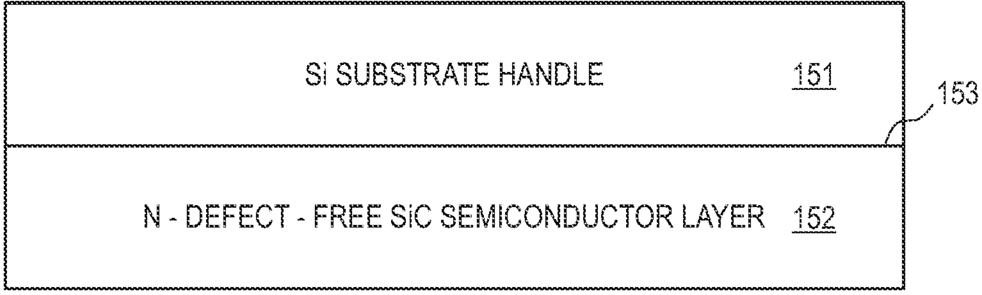
*FIG. 4d*
N - DEFECT - FREE SiC SEMICONDUCTOR LAYER 152
*FIG. 4e*

SEMICONDUCTOR DEVICE AND METHOD OF FORMING SACRIFICIAL HETEROEPITAXY INTERFACE TO PROVIDE SUBSTANTIALLY DEFECT-FREE SILICON CARBIDE SUBSTRATE

CLAIM TO DOMESTIC PRIORITY

The present application claims the benefit of U.S. Provisional Application No. 63/260,614, filed Aug. 26, 2021, which application is incorporated herein by reference.

FIELD OF THE INVENTION

The present invention relates in general to a semiconductor device and, more particularly, to a semiconductor device and method of forming a sacrificial heteroepitaxy interface to provide a substantially defect-free SiC substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., a light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, interface circuits, and other signal processing circuits.

With respect to the power MOSFET, such devices have been made with a superjunction structure. Advances have been made to merge micro-electrical-mechanical system (MEMS) layer transfer and superjunction technology. Superjunction has been an important development for power devices since the introduction of the insulated gate bipolar transistor (IGBT) in the 1980*s*. Superjunction has extended the well-known theoretical study on the limit of silicon in high-voltage devices. MEMS superjunction reduces manufacturing cost by merging MEMS processing techniques into CMOS processes to build superjunction metal oxide semiconductor (SJMOS) structures.

Superjunction can be challenging to realize in practice, due to the requirement of forming three-dimensional device structures with a high aspect ratio. SJMOS addressed the superjunction manufacturing and cost problem through a low-cost, commercially viable MEMS layer transfer and deep reactive ion etch fabrication technology. The comparison between multiple-epi and the merger of MEMS based SJMOS devices is differentiated by the number of mask layers. There can be twenty or more mask layers used in the manufacture of multi-epi, while SJMOS uses only nine mask layers.

Many semiconductor devices use a substrate made at least in part with silicon carbide (SiC) semiconductor material, such as 4H and 6H SiC. The SiC semiconductor layer or substrate provides some useful advantages, such as high breakdown voltage, high speed, reduced switching losses, high power density, high temperature, better heat dissipation, and increased bandwidth capability. However, forming the SiC layer on a Si layer produces a heterointerface between two dissimilar materials with different lattice structures and different coefficients of thermal expansion (CTE). The heterointerface causes stress during temperature cycling and leads to defects in the SiC layer, including triangle defects, carrot defects, surface pits, step bunching, microtwins, stacking faults, basal plane dislocations (BPD), micropipes (MP), threading screw dislocations (TSD), and threading edge dislocations (TED). Many attempts have been made to reduce the defect density in the SiC substrate. For example, attempts have been made to accurately control surface chemistry during the epitaxial growth. In other examples, attempts have been made to optimize etch time prior to epitaxy, to optimize the shape of the wafers via optimized crystal growth, wafering, and polishing processes, and to make use of buffer-layers, high temperature processes, intrinsic strain reduction, and patterned Si-substrates when growing SiC or 3C—SiC heteroepitaxy. The work done to date has focused on reducing defects in the SiC substrate, which has only served to increase manufacturing costs, while continuing to produce SiC substrates with high defect densities and low yield.

BRIEF DESCRIPTION OF THE DRAWINGS

FIGS. 3*a*-3*d* illustrate another process of forming a substantially defect-free SiC substrate;

FIGS. 4*a*-4*e* illustrate another process of forming a substantially defect-free SiC substrate;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1:
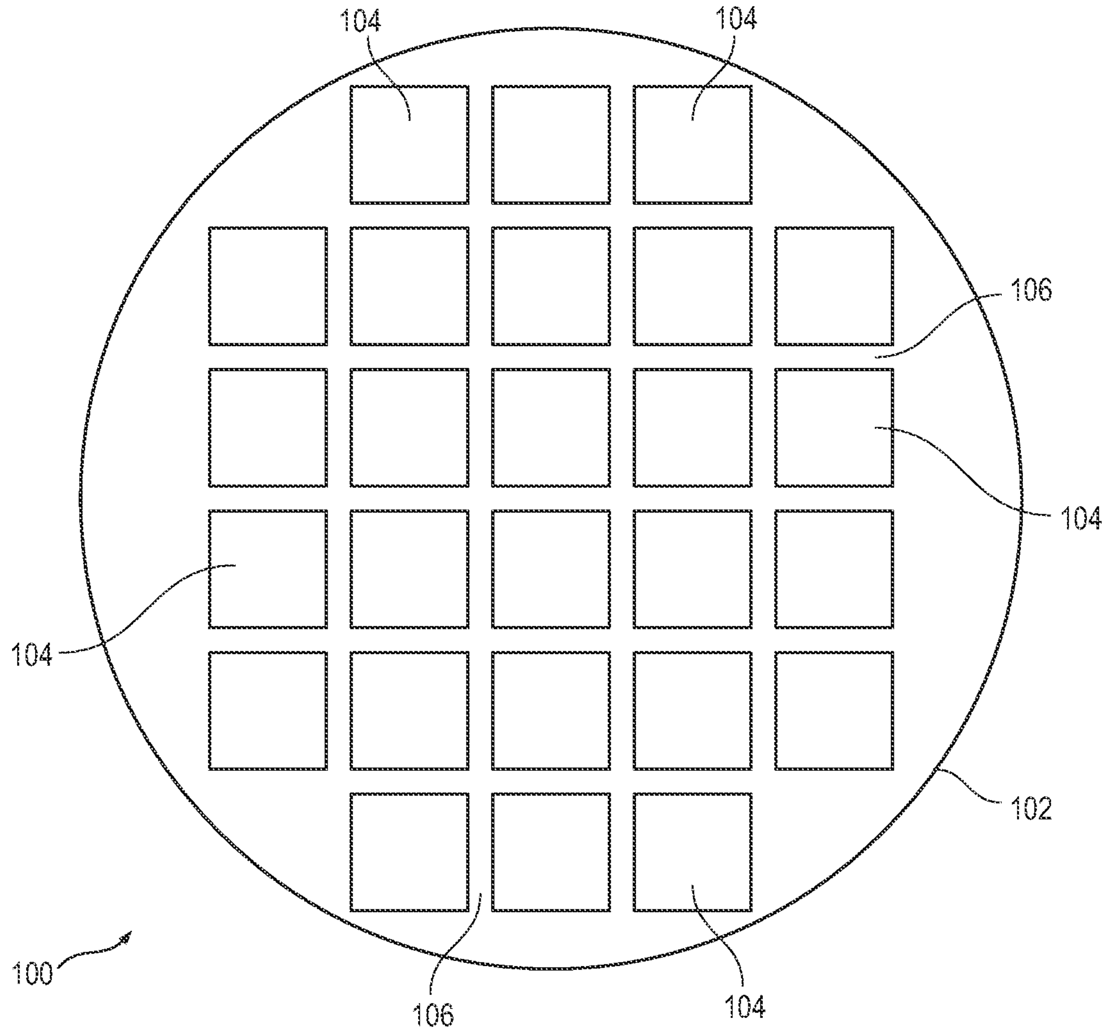
FIG. 1 illustrates a semiconductor wafer with a plurality of semiconductor die.

FIG. 1 shows semiconductor wafer or substrate 100 with a base substrate material 102, such as silicon (Si), SiC, cubic silicon carbide (3C—SiC), germanium, aluminum phosphide, aluminum arsenide, gallium arsenide, gallium nitride, indium phosphide, diamond, and all families of III-V and II-VI semiconductor materials for structural support. In one embodiment, substrate 100 includes a nearly or substantially defect-free SiC substrate, as described in FIGS. 2*a*-2*g*. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Semiconductor die 104 can be a vertical or lateral power MOSFET with gate and source terminals on a first surface of the die and drain terminals on a second surface opposite the first surface of the die. Semiconductor die 104 can be contained in a semiconductor package, such as T0220, T0247, decawat package (DPAK), double decawat package (D2PAK), TSON, micro leadframe package (MLP), dual flat no-leads (DFN), and other packages for vertical discrete devices or lateral chip scale up-drain packages.

Figure 2A:
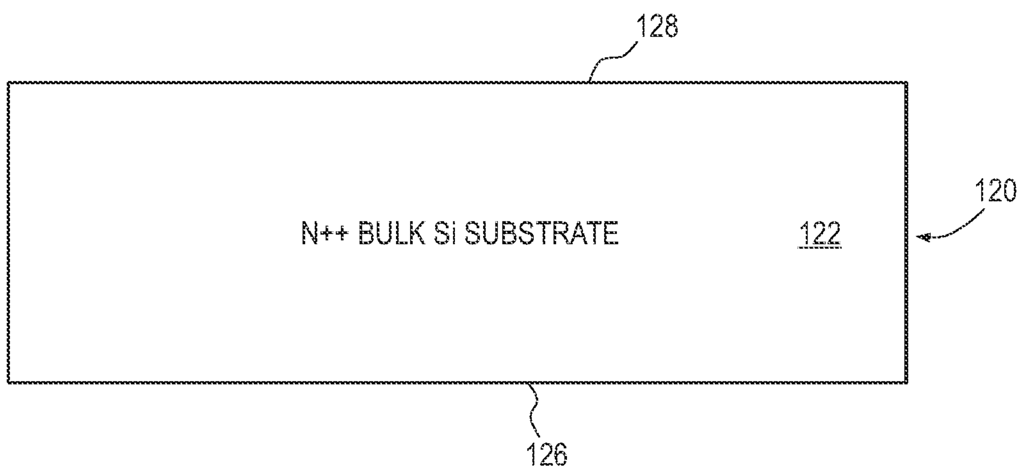
FIGS. 2*a*-2*g* illustrate a process of forming a sacrificial heteroepitaxy interface to provide a substantially defect-free SiC substrate.
Figure 2B:
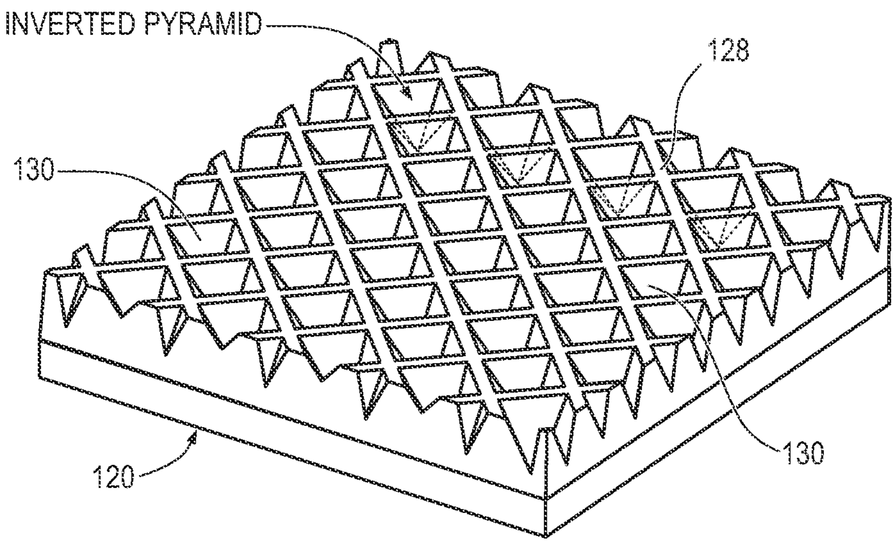

FIGS. 2*a*-2*g* illustrate a process of forming a sacrificial heteroepitaxy interface to provide a substantially defect-free SiC or 3C—SiC substrate or layer. FIG. 2*a* illustrates substrate 120 containing a base semiconductor material 122, such as Si, SiC, 3C—SiC, germanium, aluminum phosphide, aluminum arsenide, gallium arsenide, gallium nitride, indium phosphide, diamond, and all families of III-V and II-VI semiconductor materials for structural support. In one embodiment, substrate 120 contains N++ bulk Si with a thickness of about 350 micrometers (pin). Substrate 120 includes a first surface 126 and second surface 128 opposite surface 126. Substrate 120 is a sacrificial, inverted pyramid patterned, compliant, bulk Si substrate. Substrate 120 is sacrificial as it will be later removed. Surface 128 of substrate 120 is an inverted pyramid patterned textured surface, as shown in FIG. 2*b*. Small inverted pyramid-shaped voids 130 are patterned and etched into surface 128 to create a structured substrate 120.

The structured substrate 120 comes from the consideration that the stacking faults (SF) lie on (111) planes and can interact with each other, stopping the propagation. With two SFs laying, for example, in the (111) and (11-1) planes, the SFs can cross, and the structure is able to stop the propagation of one or even both SFs to improve the crystalline quality of the film surface because the SFs remain buried in the epilayer. The rate of SF annihilation is inversely related to SF density, however, by means of the inverted pyramid pattern, allowing for a significant drop in SF concentration just within a few microns from the heterointerface allows that defect density to decrease with increasing epitaxial layer thickness. The unique pyramid shape can concentrate SFs in small areas, enhancing the phenomenon of SF annihilation.

Figure 2C:
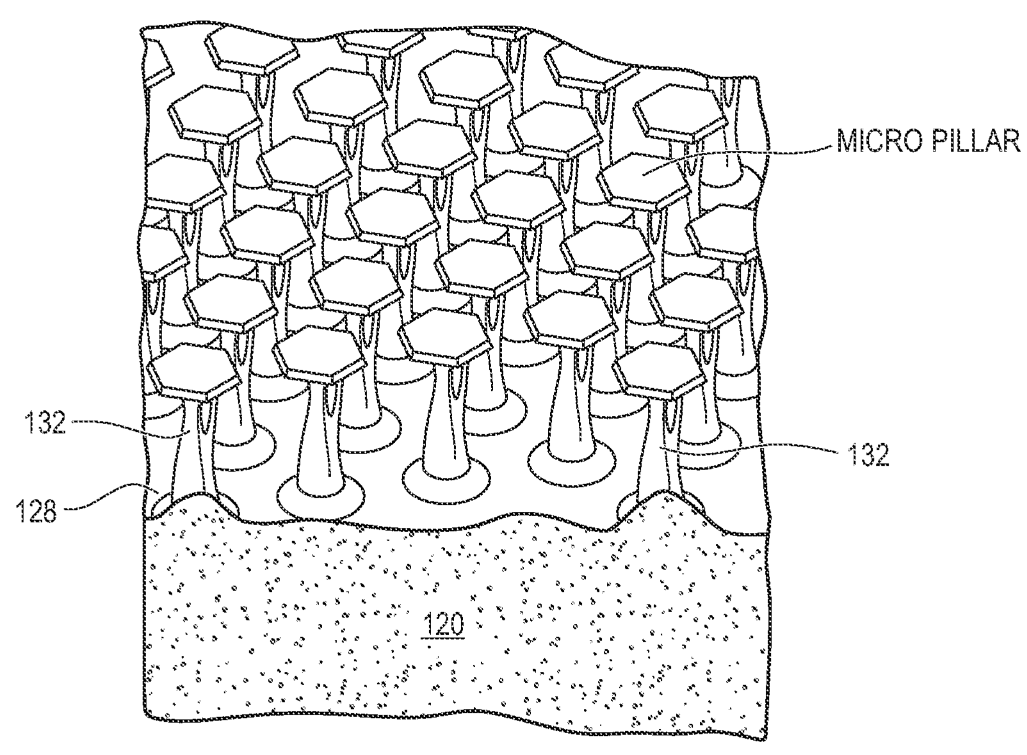
Figure 2D:
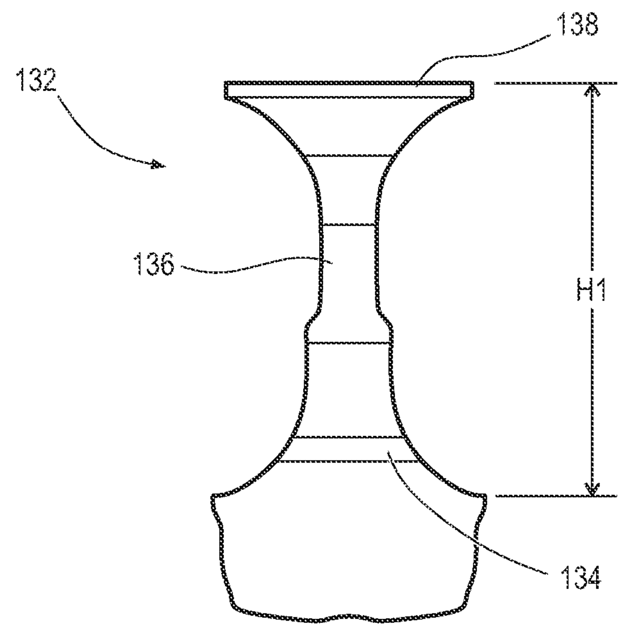

In another embodiment, a plurality of micropillars 132 is patterned and formed into hexagonal arrays on surface 128 of substrate 120 by a dry etching process, as shown in FIG. 2*c*. Micropillars 132 can be made with Si. FIG. 2*d* illustrates one micropillar 132 with base 134, stem 136, and pedestal 138. The height H1 of micropillar 132 is about 9.35 μm. Pedestal 138 of one micropillar 132 may contact another pedestal of an adjacent micropillar. The compliant substrate 120 with micropillars 132 releases the stress developed in 3C—SiC grown on Si substrate, due to the lattice mismatch and the different CTE between 3C—SiC and Si.

Figure 2E:
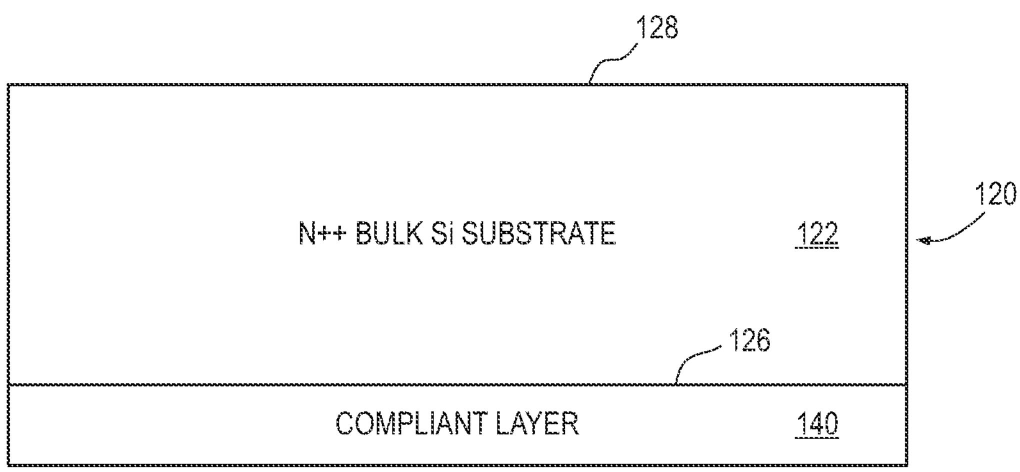

In FIG. 2*e*, compliant layer 140 is deposited on surface 126 using physical vapor deposition (PVD), chemical vapor deposition (CVD), plasma enhanced chemical vapor deposition (PECVD), low pressure chemical vapor deposition (LPCVD), tetraethylorthosilicate (TEOS), or other suitable deposition process. In one embodiment, compliant layer 140 includes a polysilicon or oxide layer formed using LPCVD to a thickness of 2-3 μm.

Figure 2F:
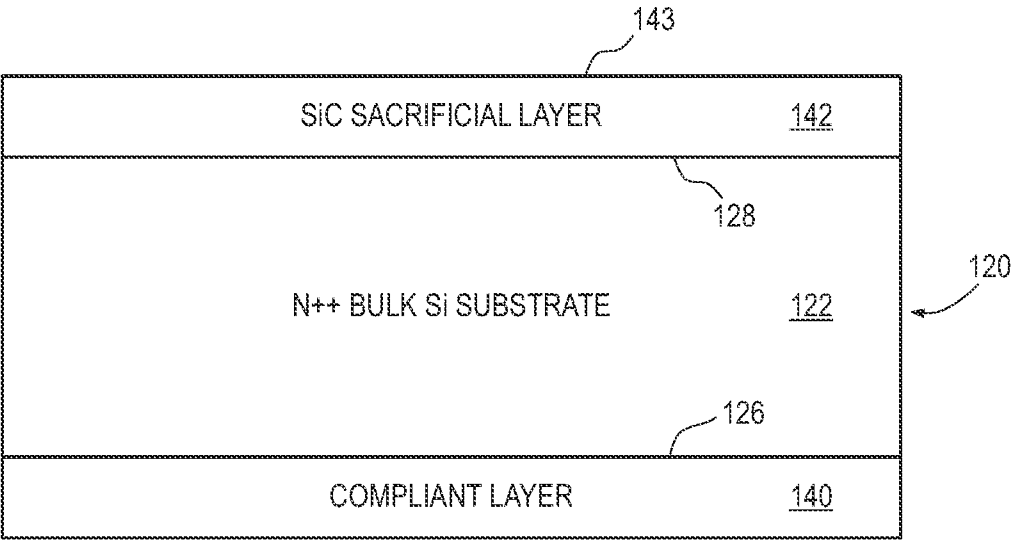

In FIG. 2*f*, substrate 120 and compliant layer 140 provide the foundation to grow a desired substantially defect-free SiC or 3C—SiC substrate. In particular, a thin film sacrificial layer 142 is grown on the inverted pyramid patterned and textured growth (or micro-pillar 132) surface 128. Sacrificial layer 142 is a heteroepitaxy, high defect density semiconductor layer. In one embodiment, sacrificial layer 142 is a SiC or 3C—SiC layer formed using a hot wall CVD chamber or reactor to a thickness of 3-6 μm. The heteroepitaxy growth involves dissimilar materials, e.g., SiC or 3C—SiC sacrificial layer 142 on Si substrate 120. In the hot wall CVD reactor, heat is radiated to the substrate from the chamber walls to achieve a uniform temperature distribution and uniform coating thickness. The reaction uses multiple steps at varying temperatures, including carbonization step at 1100° C. and SiC growth at 1380° C.

Figure 2G:
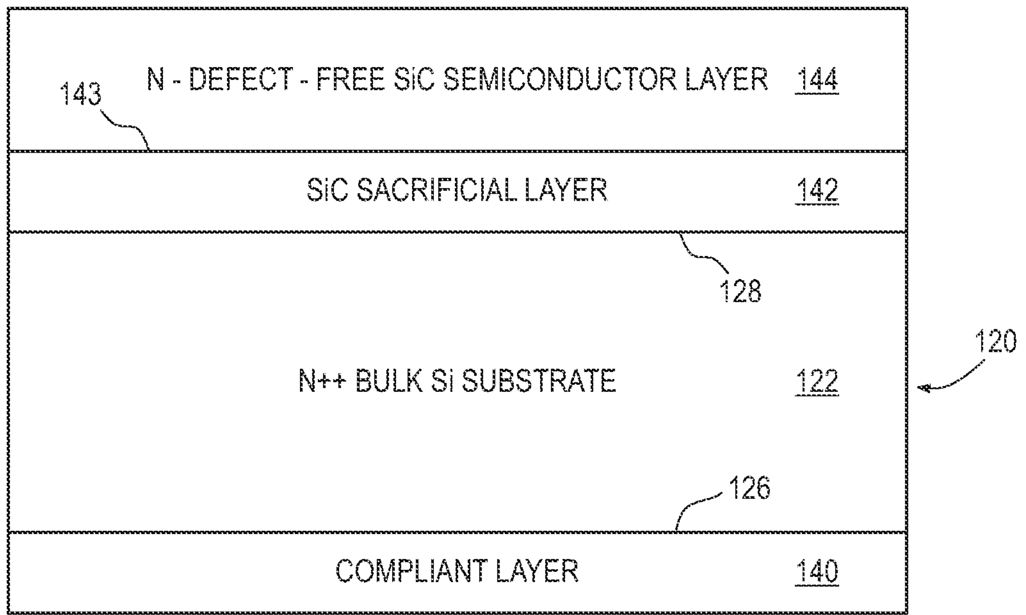

In FIG. 2*g*, semiconductor layer 144 is epitaxially grown over surface 143 of sacrificial layer 142. In one embodiment, semiconductor layer 144 is implanted with n-type dopant, e.g., phosphorus at 7.3e14 atoms/$cm^3$ to form an N− SiC epi or N— 3C—SiC epi layer with a thickness of 30-60 μm using MEMS layer transfer process.

An important structure to avoid bow warp has a epitaxial growth as follows. Six 3C—SiC on Si epi wafers exhibit growth on 1.0 mm by 152.4 mm Si substrates to ensure ≤250 μm of wafer bow over the total wafer diameter, growth of 4.0 μm of 1E18 n-type doped 3C—SiC (buffer layer), and growth of 6.0 μm of 2E16 n-type doped 3C—SiC (device layer) on the buffer layer.

Of particular relevance is that the contact between semiconductor material 122 (Si) and semiconductor layer 142 (SiC or 3C—SiC) involves a heterointerface between two dissimilar materials with different lattice structures and different CTE. The growth of the SiC or 3C—SiC semiconductor layers 144 over Si substrate 120, cycling over a temperature range, creates stress and strain at the hetero-boundary around surface 128, which results in defects in or around the interface regions. The density of defects can be significant at the interface region proximate to surface 128, hence semiconductor layer 142 is characterized as having a high defect density. Small inverted pyramid-shaped voids 130, or micropillars 132, formed in surface 128 operate to self-annihilate or otherwise relieve the stress and associated expansion of defects. With compliant layer 140, substrate 120 softens during extreme temperature cycles in formation of the SiC or 3C—SiC semiconductor layer 142 so the stress and strain inherent to heteroepitaxy growth can reside in, and are substantially limited to, substrate 120 and semiconductor layer 142. Defects are confined to about 3-6 μm from surface 128 into semiconductor layer 142 and about 3-6 μm from surface 128 into semiconductor material 122. The SiC or 3C—SiC semiconductor layer 144 is nearly defect-free, because the defects substantially occur in and are confined to sacrificial semiconductor layer 142.

Figure 3A:
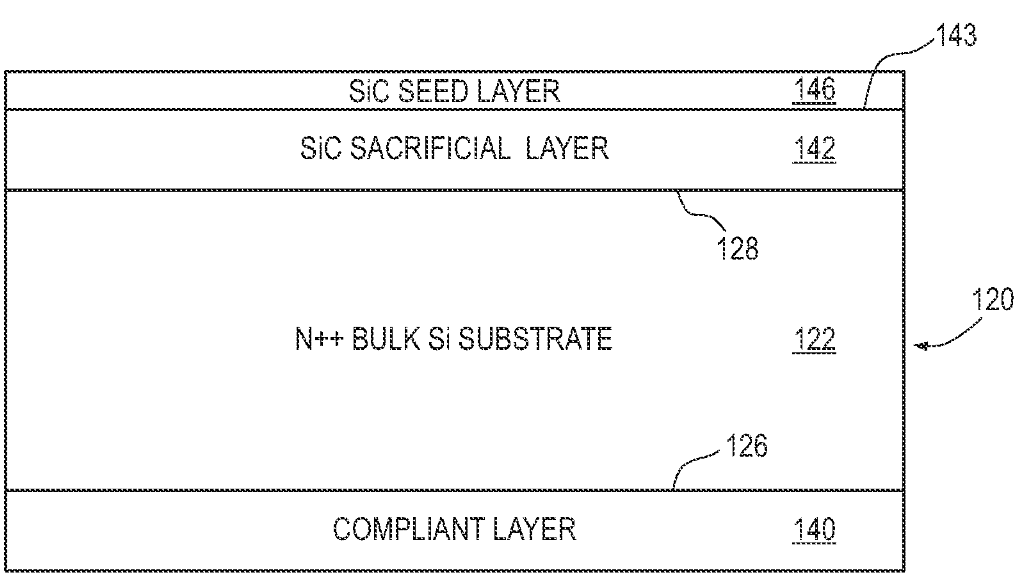

In another embodiment, continuing from FIG. 2*f* and as shown in FIG. 3*a*, seed layer 146 is epitaxially grown on surface 143 of sacrificial layer 142 at a temperature less than the melting point of base Si semiconductor material 122, i.e., about 1275-1414° C. In one embodiment, the temperature is about 1350° C. Seed layer 146 can be SiC or 3C—SiC with a thickness of 10-50 mm. In this case, sacrificial layer 142 is SiC or 3C—SiC.

Figure 3B:
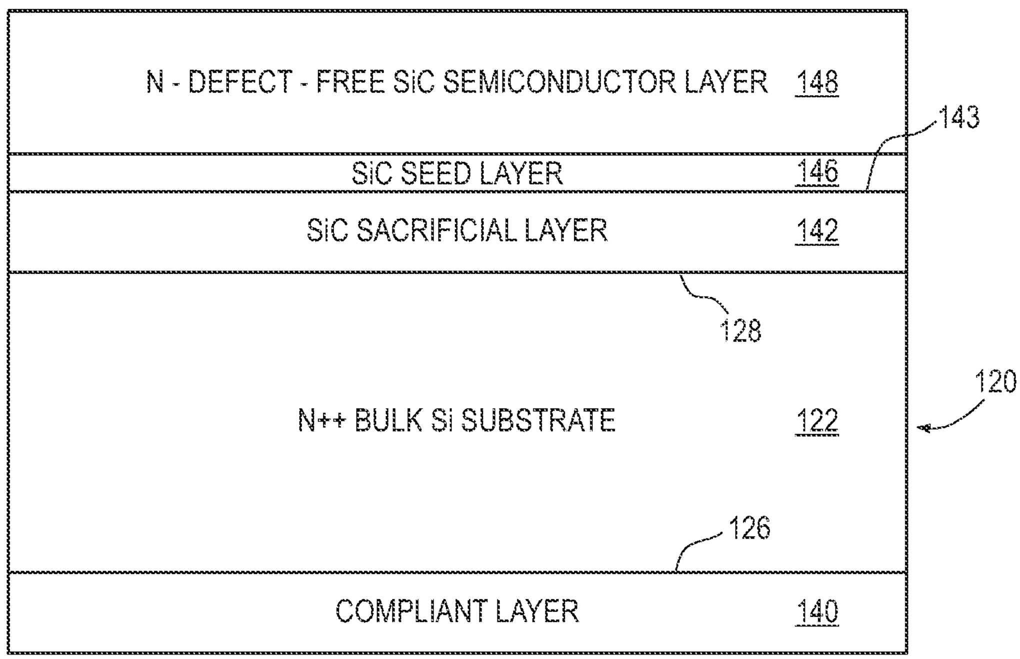

In FIG. 3*b*, semiconductor layer 148 is epitaxially grown over seed layer 146 to a thickness of 200.0 μm, at temperature greater than the melting point of base Si semiconductor material 122 and compliant layer 140, i.e., above 1414° C. In one embodiment, the temperature is about 1700° C. Semiconductor layer 148 is implanted with n-type dopant, e.g., phosphorus at 7.3e14 atoms/$cm^3$ to form an N− SiC epi or N— 3C—SiC epi layer with a thickness of 30-60 μm using MEMS layer transfer process. The formation of semiconductor layer 148 substantially absorbs seed layer 146.

While SiC sacrificial layer 142 has a high defect density, seed layer 146 and semiconductor layer 148 have a relatively low defect density, i.e., substantially defect-free, because the defects have been confined to the SiC sacrificial layer. Using the higher melting point of SiC material as compared to Si material, a substantial portion if not all of the Si material (substrate 120 and compliant layer 140) is melted away, as shown in FIG. 3*c*. For example, Si material of substrate 120 and compliant layer 140 are being removed above 1500° C.

In FIG. 3*d*, SiC sacrificial layer 142 and any remaining portion of seed layer 146 is removed by a grinding operation, deleting any remnant of the heterointerface including defects in the sacrificial layer, leaving nearly or substantially defect-free SiC material in semiconductor layer 148. Any CTE mismatch and lattice mismatch would have been reduced or eliminated. The SiC or 3C—SiC semiconductor layer 148 is nearly or substantially defect-free, because the defects have been confined to and removed in the Si material and SiC sacrificial layer 142.

Figure 4A:
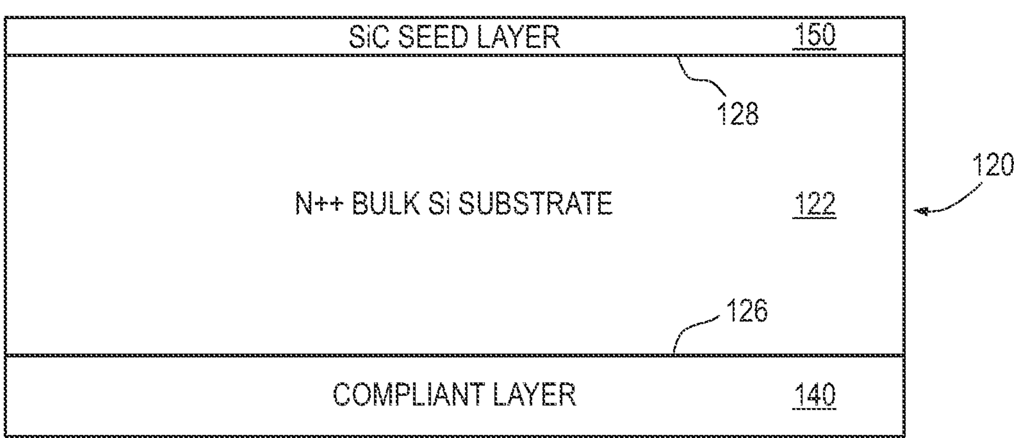

In another embodiment, continuing from FIG. 2*e* and as shown in FIG. 4*a*, seed layer 150 is epitaxially grown on surface 128 of substrate 120 at a temperature less than the melting point of base Si semiconductor material 122, i.e., about 1275-1414° C. Seed layer 150 can be SiC or 3C—SiC with a thickness of 10-50 μm.

Figure 4B:
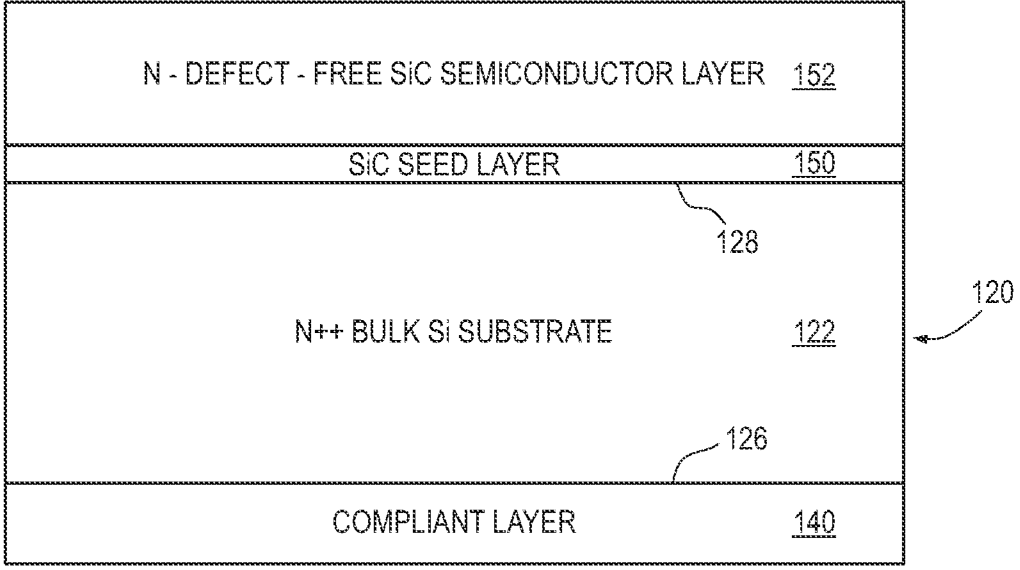

In FIG. 4*b*, semiconductor layer 152 is epitaxially grown over seed layer 150. In one embodiment, semiconductor layer 152 is implanted with n-type dopant, e.g., phosphorus at 7.3e14 atoms/cm$^3$ to form an N− SiC epi or N— 3C—SiC epi layer with a thickness of 30-60 μm using hot wall CVD epitaxial growth. Si substrate 122 will contain a high defect density region proximate to surface 128 to a depth of 4-5 μm. The formation of semiconductor layer 152 substantially absorbs seed layer 150.

In FIG. 4*c*, Si substrate 151 is bonded to surface 153 of SiC semiconductor layer 152. Si substrate 151 operates a support base or handle for a grinding operation. In FIG. 4*d*, seed layer 150, Si substrate 122, and compliant layer 140 are removed by a grinding operation, deleting any remnant of the heterointerface including defects in the Si substrate, and leaving nearly defect-free SiC material in semiconductor layer 152. In FIG. 4*e*, Si substrate handle 151 is removed leaving nearly defect-free SiC material in semiconductor layer 152.

Alternatively, semiconductor layer 152 is epitaxially grown over seed layer 150 to a thickness of 200.0 μm, at a temperature greater than the melting point of base Si semiconductor material 122 and compliant layer 140, i.e., above 1414° C. In one embodiment, the temperature is about 1700° C. Semiconductor layer 152 is implanted with n-type dopant, e.g., phosphorus at 7.3e14 atoms/cm$^3$ to form an N− SiC epi or N— 3C—SiC epi layer with a thickness of 30-60 μm using MEMS layer transfer process.

While N++ bulk Si substrate 122 has a high defect density region proximate to surface 128 to a depth of 4-5 μm, seed layer 150 and semiconductor layer 152 have a relatively low defect density, i.e., substantially defect-free, because the defects have been confined to the bulk Si substrate. Using the higher melting point of SiC material as compared to Si material, a substantial portion if not all of the Si material (substrate 120 and compliant layer 140) is melted away, deleting any remnant of the heterointerface including defects in the Si substrate, and leaving nearly defect-free SiC material in semiconductor layer 152. For example, Si material of substrate 120 and compliant layer 140 are being removed above 1500° C. Any remaining portion of seed layer 150 is removed by a grinding operation, leaving nearly defect-free SiC material in semiconductor layer 152, similar to FIG. 4*e*.

Figure 5A:
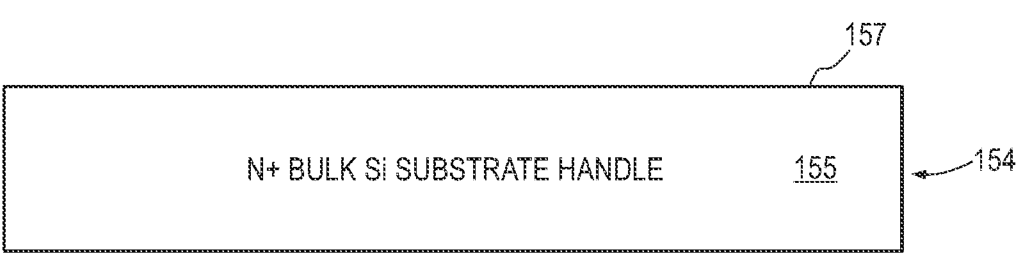
FIGS. 5*a*-5*d* illustrate a process of forming a semiconductor layer over a substrate.

FIG. 5*a* illustrates substrate 154 containing a base semiconductor material 155, such as Si, SiC, 3C—SiC, germanium, aluminum phosphide, aluminum arsenide, gallium arsenide, gallium nitride, indium phosphide, diamond, and all families of III-V and II-VI semiconductor materials for structural support. In one embodiment, substrate 154 is a heavily doped N+Si substrate with a thickness of 700 μm.

Figure 5B:
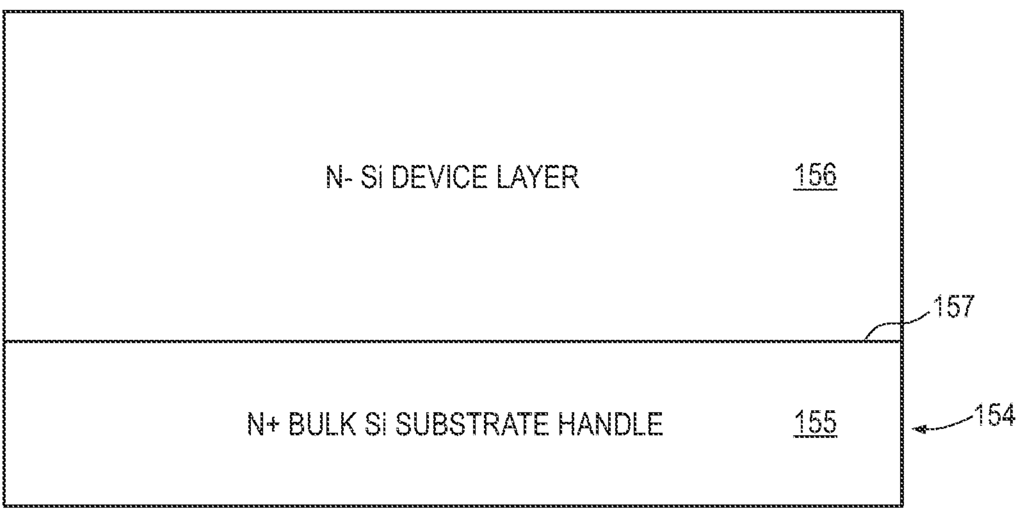

In FIG. 5*b*, semiconductor layer 156 is epitaxially grown on surface 157 of substrate 154. The epitaxial growth or deposition occurs in a reaction chamber at a temperature of about 750-1700° C. In one embodiment, semiconductor layer 156 is doped with phosphorus at 6e15 atoms/cm$^3$ to form an N− Si epi layer with a thickness of 50-60 mm. Semiconductor layer 156 operates as a device layer designated for formation of a semiconductor device, such as a power MOSFET.

Figure 5C:
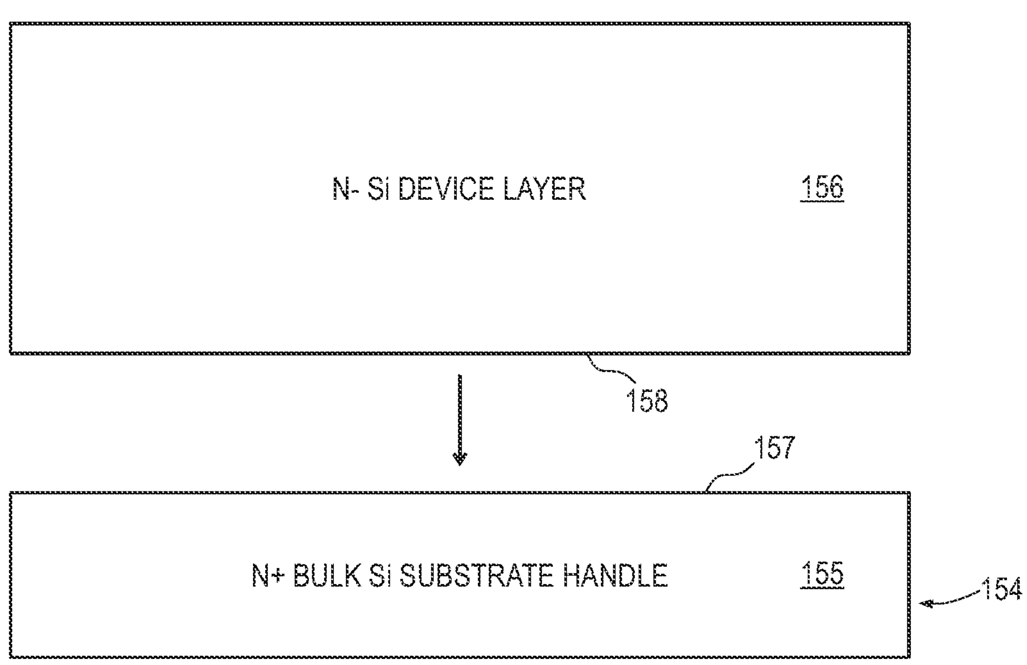
Figure 5D:
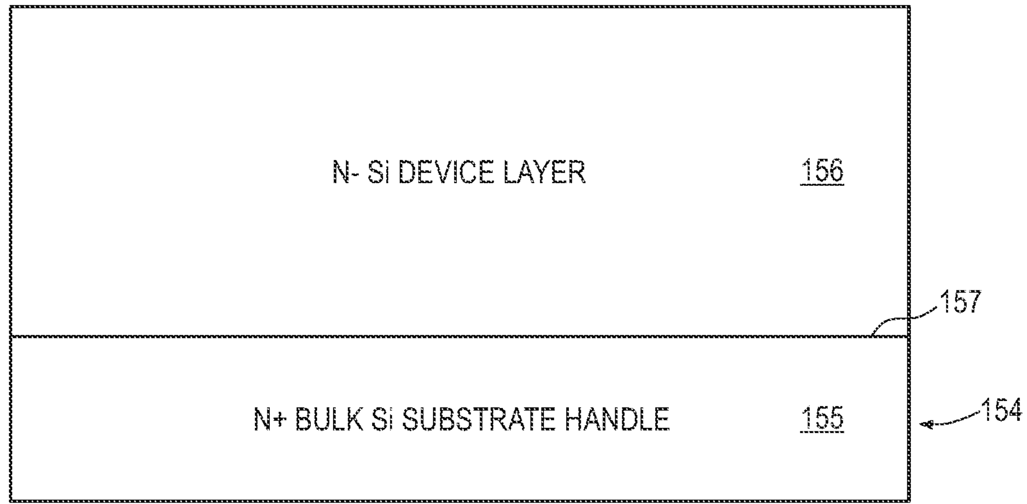

Alternatively, semiconductor layer 156 can be joined to substrate 154 using a high temperature anneal, fusion bonding, plasma activated direct wafer bonding (DWB), or other DWB. In FIG. 5*c*, semiconductor layer 156 is disposed over surface 157 of substrate 154. Surface 158 of semiconductor layer 156 and surface 157 of substrate 154 are planarized, polished, and cleaned to be flat and smooth, prior to bonding. The lattice structures of semiconductor layer 156 and substrate 154 can be aligned to optimize adhesion. Water molecules can be applied to surfaces 157 and 158 to aid in the bonding process. Surface 158 of semiconductor layer 156 is brought into contact with surface 157 of substrate 154. DWB is accomplished with chemical bonds and intermolecular interactions at temperature, including van der Waals forces, hydrogen bonds, and covalent bonds, between surface 157 and surface 158. DWB temperatures range from ambient to 100's° C. FIG. 5*d* shows semiconductor layer 156 direct wafer bonded to surface 157 of substrate 154.

Figure 6A:
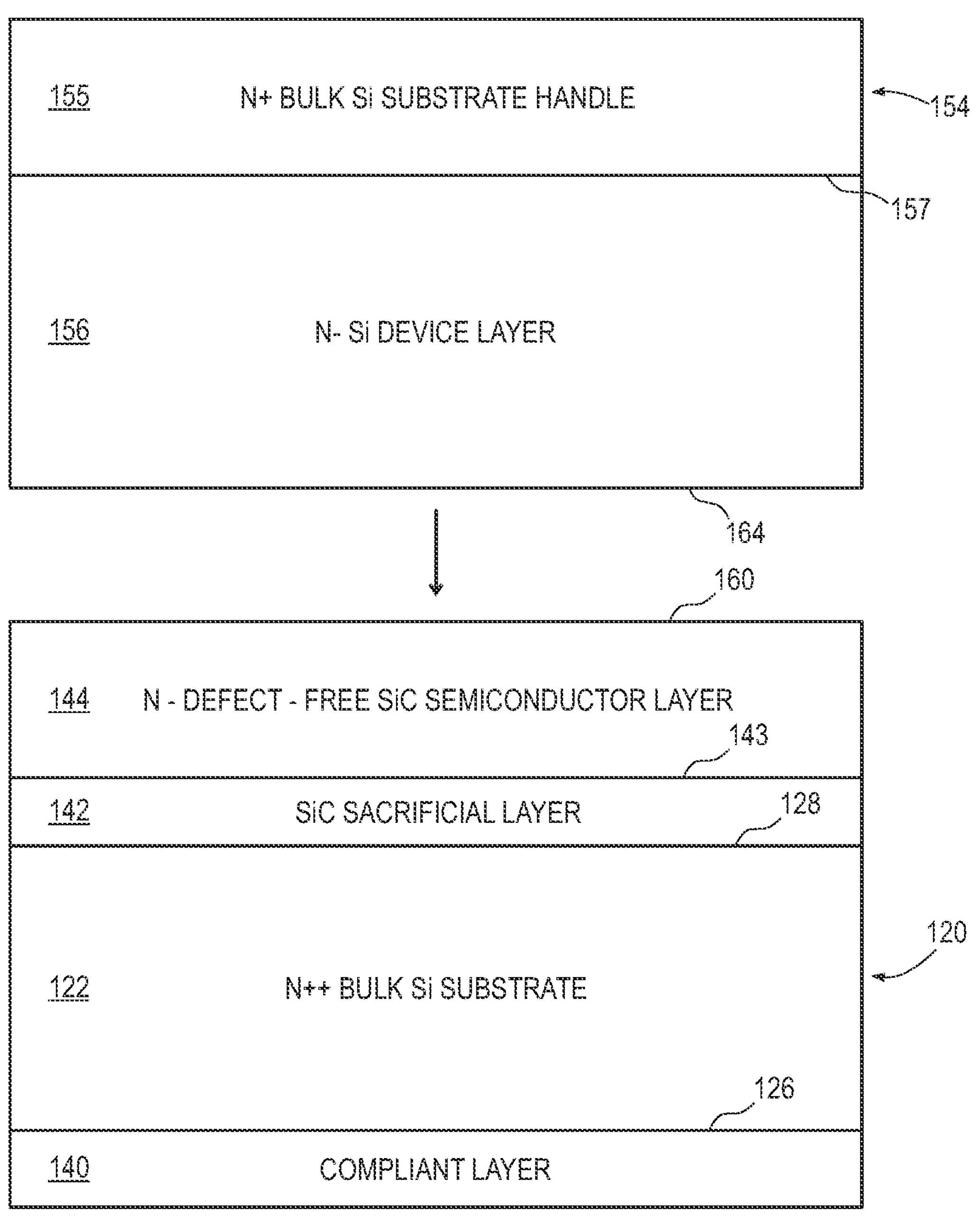
FIGS. 6*a*-6*c* illustrate a process of bonding the structure from FIG. 5*d* to the structure from FIG. 2*g;*
Figure 6B:
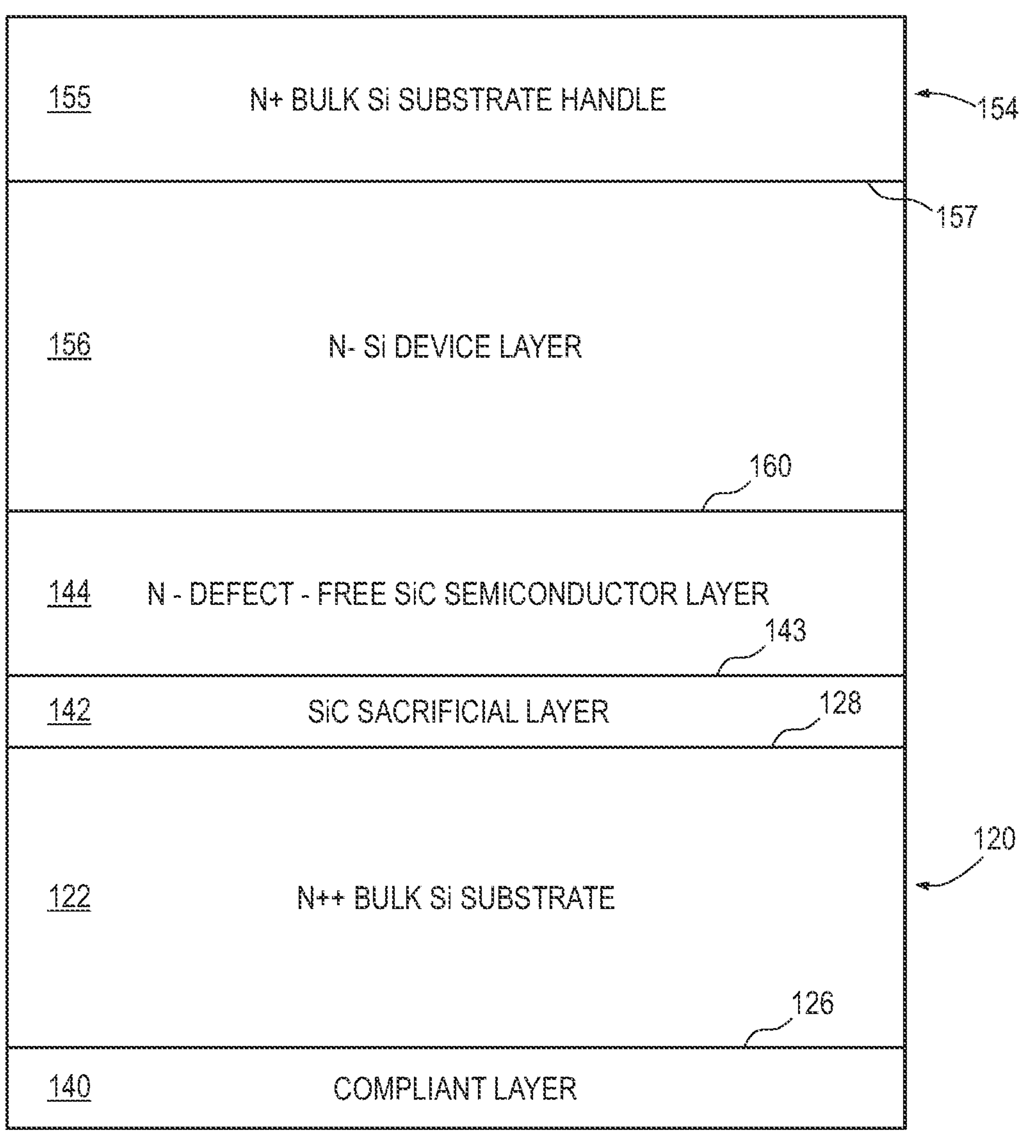
Figure 6C:
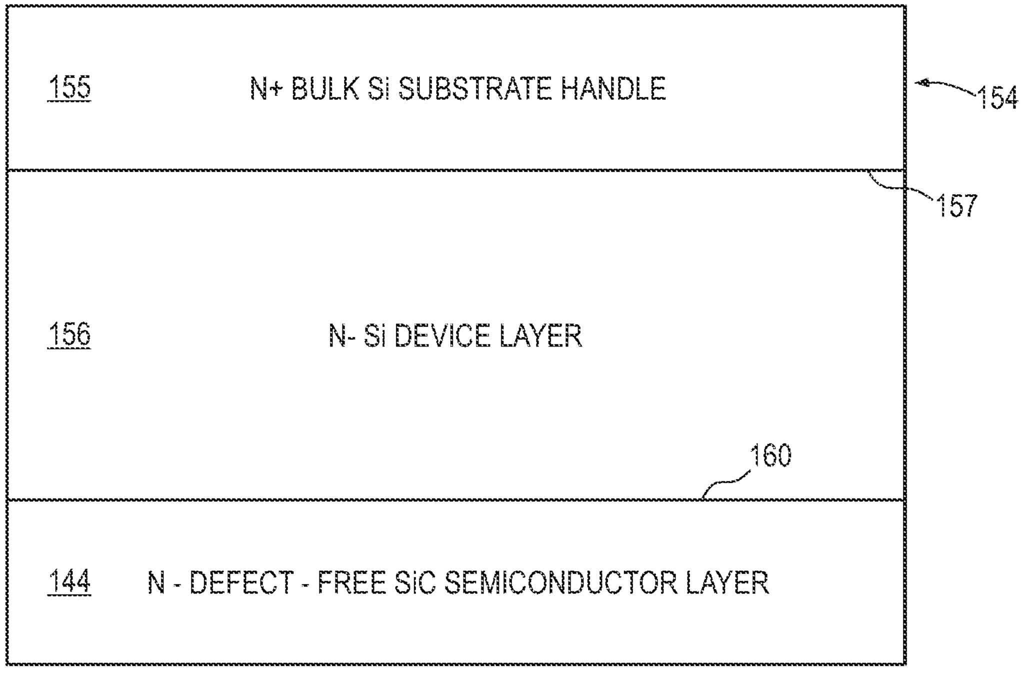

In one embodiment shown in FIGS. 6*a*-6*c*, the combination of substrate 154 and semiconductor layer 156 from FIG. 5*b* or 5*d* is joined to semiconductor layer 144 from FIG. 2*g* using a high temperature anneal, fusion bonding, plasma activated DWB, or other DWB. The semiconductor layers shown in the figures are not drawn to scale.

FIG. 6*a* illustrates the combination of substrate 154 and semiconductor layer 156 from FIG. 5*b* or 5*d* disposed over surface 160 of semiconductor layer 144. Surface 160 of semiconductor layer 144 and surface 164 of semiconductor layer 156 are planarized, polished, and cleaned to be flat and smooth, prior to bonding. The lattice structures of semiconductor layer 156 and semiconductor layer 144 can be aligned to optimize adhesion. Water molecules can be applied to surfaces 160 and 164 to aid in the bonding process. Surface 164 of semiconductor layer 156 is brought into contact with surface 160 of semiconductor layer 144. DWB is accomplished with chemical bonds and intermolecular interactions at temperature, including van der Waals forces, hydrogen bonds, and covalent bonds, between surface 160 and surface 164. DWB temperatures range from ambient to 100's ° C.

FIG. 6*b* shows semiconductor layer 156 direct wafer bonded to surface 160 of semiconductor layer 144. Surface 160 of semiconductor layer 146 is substantially oxide/defect-free Si face to enable direct covalent bonding to Si face of surface 164 of semiconductor layer 156. The interface between semiconductor layer 144 and semiconductor layer 156 exhibits a strong bond with little or no defects in the crystalline structure.

In FIG. 6*c*, compliant layer 140, sacrificial substrate 120, and sacrificial semiconductor layer 142 are removed by chemical etching, CMP, mechanical peel-off, mechanical grinding, thermal bake, UV light, or wet stripping, leaving N+ Si substrate 154, N− semiconductor device layer 156, and substantially defect-free N− SiC or 3C—SiC semiconductor layer 144. The removal of the sacrificial layers 120 and 142 takes away or eliminates the defects formed by the heteroepitaxial interface and associated lattice mismatch and different CTEs of the dissimilar materials. The above process allows for the formation of defects at the heteroepitaxial interface but confines the defects to the sacrificial layers and then removes the defective material leaving nearly or substantially defect-free semiconductor layer 144.

Figure 7A:
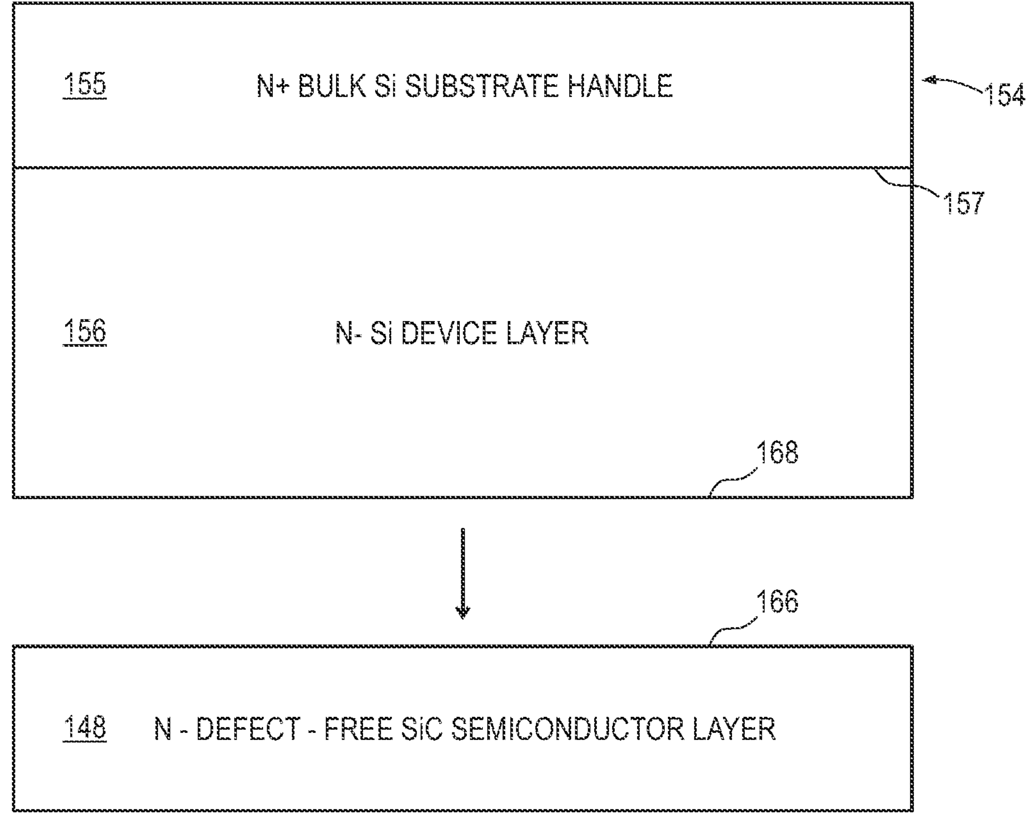
FIGS. 7*a*-7*b* illustrate a process of bonding the structure from FIG. 5*d* to the structure from FIG. 3*d* or 4*e;*
Figure 7B:
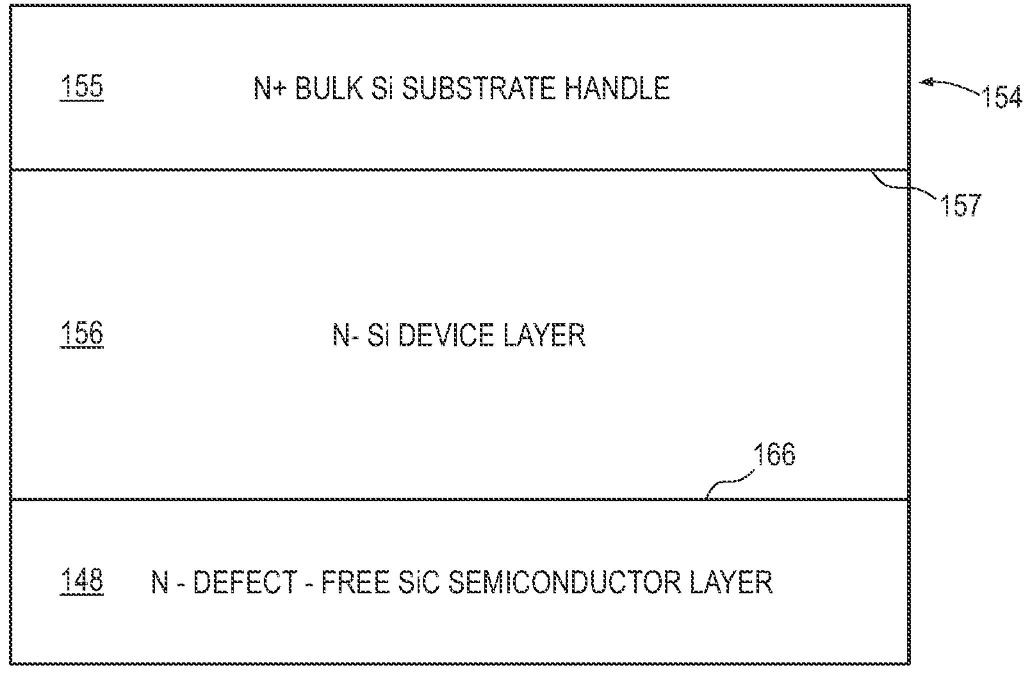

In another embodiment shown in FIGS. 7*a*-7*b*, the combination of substrate 154 and semiconductor layer 156 from FIG. 5*b* or 5*d* is joined to semiconductor layer 148 from FIG. 3*d* or semiconductor layer 152 from FIG. 4*e* using a high temperature anneal, fusion bonding, plasma activated DWB, or other DWB. The following discussion uses semiconductor layer 148, although the same applies to semiconductor layer 152. The semiconductor layers shown in the figures are not drawn to scale.

FIG. 7*a* illustrates the combination of substrate 154 and semiconductor layer 156 from FIG. 5*b* or 5*d* disposed over surface 166 of semiconductor layer 148. Surface 166 of semiconductor layer 148 and surface 168 of semiconductor layer 156 are planarized, polished, and cleaned to be flat and smooth, prior to bonding. The lattice structures of semiconductor layer 156 and semiconductor layer 148 can be aligned to optimize adhesion. Water molecules can be applied to surfaces 166 and 168 to aid in the bonding process. Surface 168 of semiconductor layer 156 is brought into contact with surface 166 of semiconductor layer 148. DWB is accomplished with chemical bonds and intermolecular interactions at temperature, including van der Waals forces, hydrogen bonds, and covalent bonds, between surface 166 and surface 168. DWB temperatures range from ambient to 100's ° C.

FIG. 7*b* shows semiconductor layer 156 direct wafer bonded to surface 166 of semiconductor layer 148. Surface 166 of semiconductor layer 148 is substantially oxide/defect-free Si face to enable direct covalent bonding to Si face of surface 168 of semiconductor layer 156. The interface between semiconductor layer 148 and semiconductor layer 156 exhibits a strong bond with little or no defects in the crystalline structure.

Figure 8A:
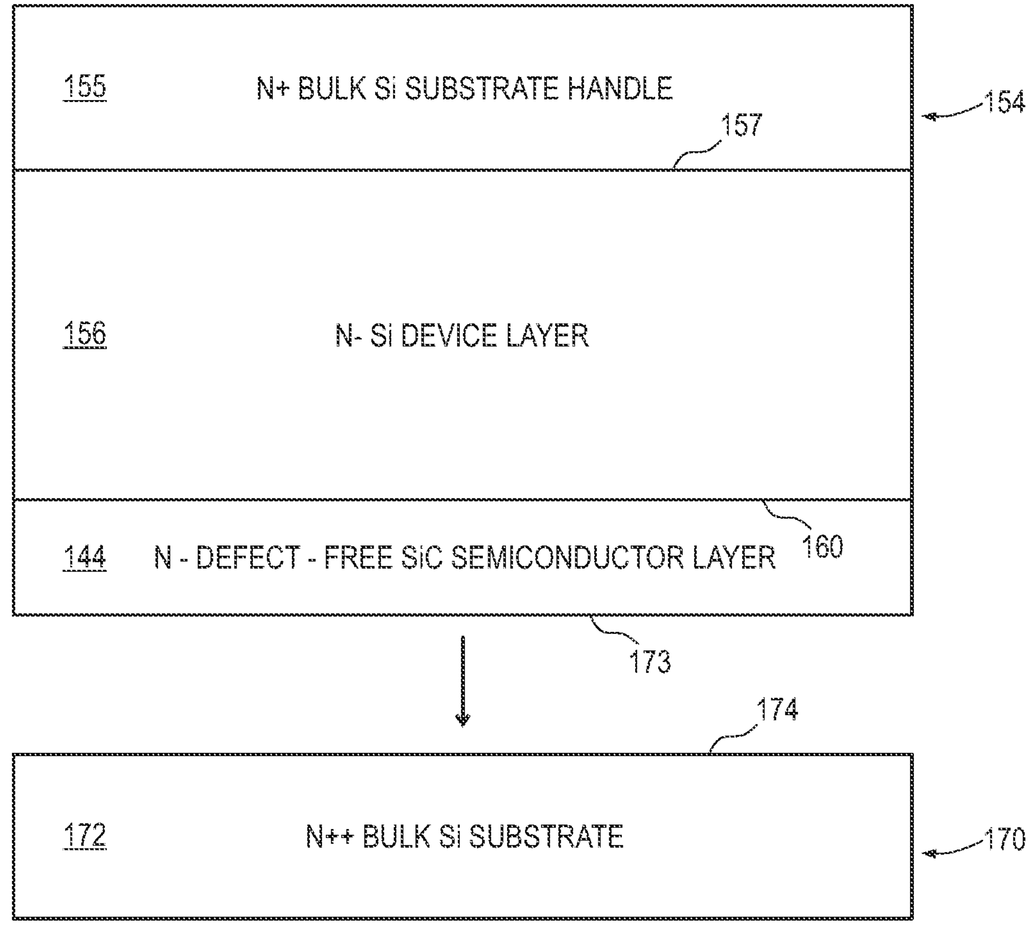
FIGS. 8*a*-8*c* illustrate a process of bonding the structure from FIG. 6*c* or 7*b* to a substrate.

The structure from FIG. 6*c* or FIG. 7*b* is joined to substrate 170 using a high temperature anneal, fusion bonding, plasma activated DWB, or other DWB. In FIG. 8*a*, the structure from FIG. 6*c* or 7*b* is disposed over surface 174 of substrate 170. Substrate 170 contains semiconductor material 172. In one embodiment, semiconductor material 172 is N++ Si or SiC. Surface 173 of semiconductor layer 144 and surface 174 of substrate 170 are planarized, polished, and cleaned to be flat and smooth, prior to bonding. The lattice structures of semiconductor layer 144 and substrate 170 can be aligned to optimize adhesion, Water molecules can be applied to surfaces 173 and 174 to aid in the bonding process. Surface 173 of semiconductor layer 144 is brought into contact with surface 174 of substrate 170. DWB is accomplished with chemical bonds and intermolecular interactions at temperature, including van der Waals forces, hydrogen bonds, and covalent bonds, between surface 173 and surface 174. DWB temperatures range from ambient to 100's ° C.

Figure 8B:
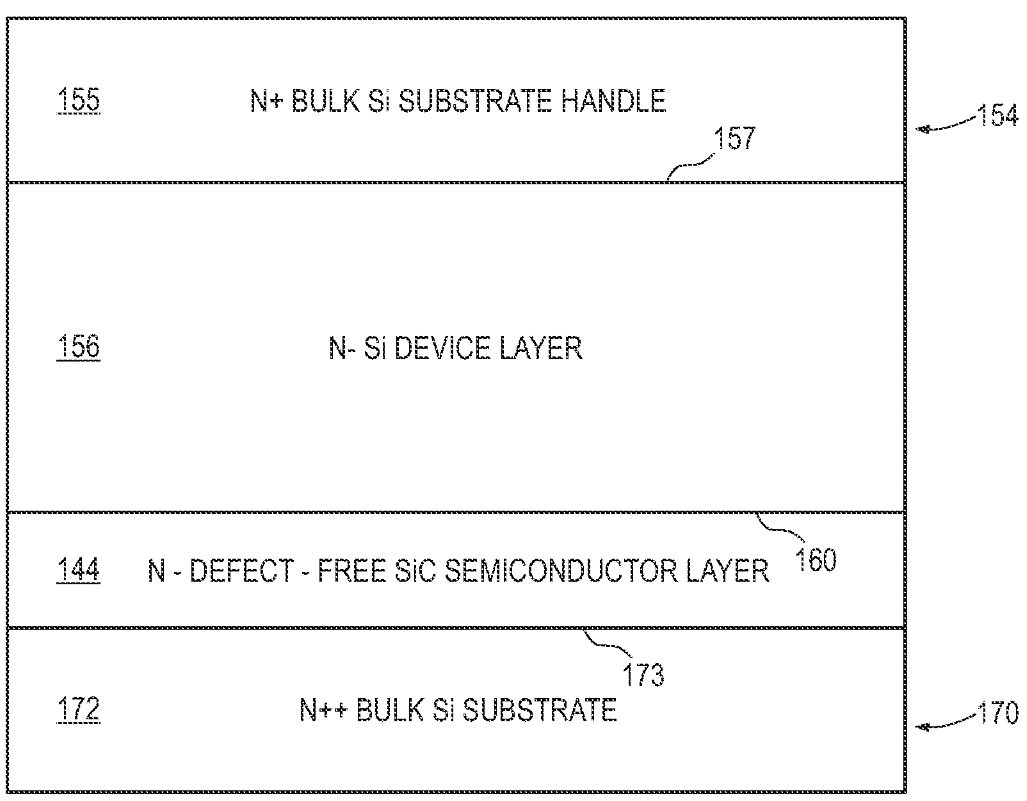

FIG. 8*b* shows semiconductor layer 144 direct wafer bonded to surface 174 of substrate 170. Substrate 170 operates as a handle or leverage point to remove substrate 154, without damage to semiconductor layer 144. Substrate 154 is removed by chemical etching, CMP, mechanical peel-off, mechanical grinding, thermal bake, UV light, or wet stripping.

Figure 8C:
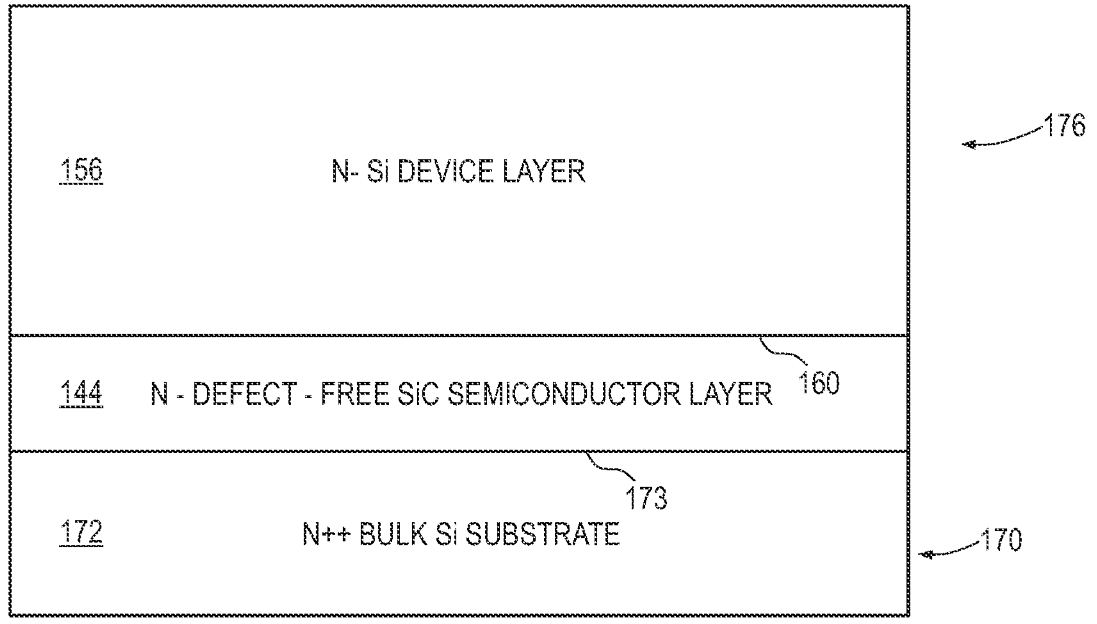

FIG. 8*c* shows SiC or 3C—SiC engineered substrate 176 containing N− Si semiconductor device layer 156, substantially defect-free N− SiC or 3C—SiC semiconductor layer 144, and N++Si or SiC substrate 170, following removal of substrate 154. The sacrificial semiconductor layer 142 or Si substrate 120 containing substantially all the defects resulting from the heteroepitaxy interface has been removed, leaving semiconductor layer 144 near or substantially defect-free. In the prior art, work has focused on reducing defects. The present invention is not based on reducing defect generation, as discussed in the Background, but rather is about confining the defects to semiconductor layer 142 or Si substrate 120, and then removing the high defect density layer 142 or Si substrate 120. Engineered substrate 176 can be made at substantially less cost than conventional SiC substrates, while achieving near or substantially defect-free SiC base material.

The SiC or 3C—SiC engineered substrate 176, as described in FIGS. 2-8, can be used as a foundation to form a variety of semiconductor devices. For example, engineered substrate 176 can be used as a SiC or 3C—SiC foundation to form a high voltage power MOSFET.

Figure 9:
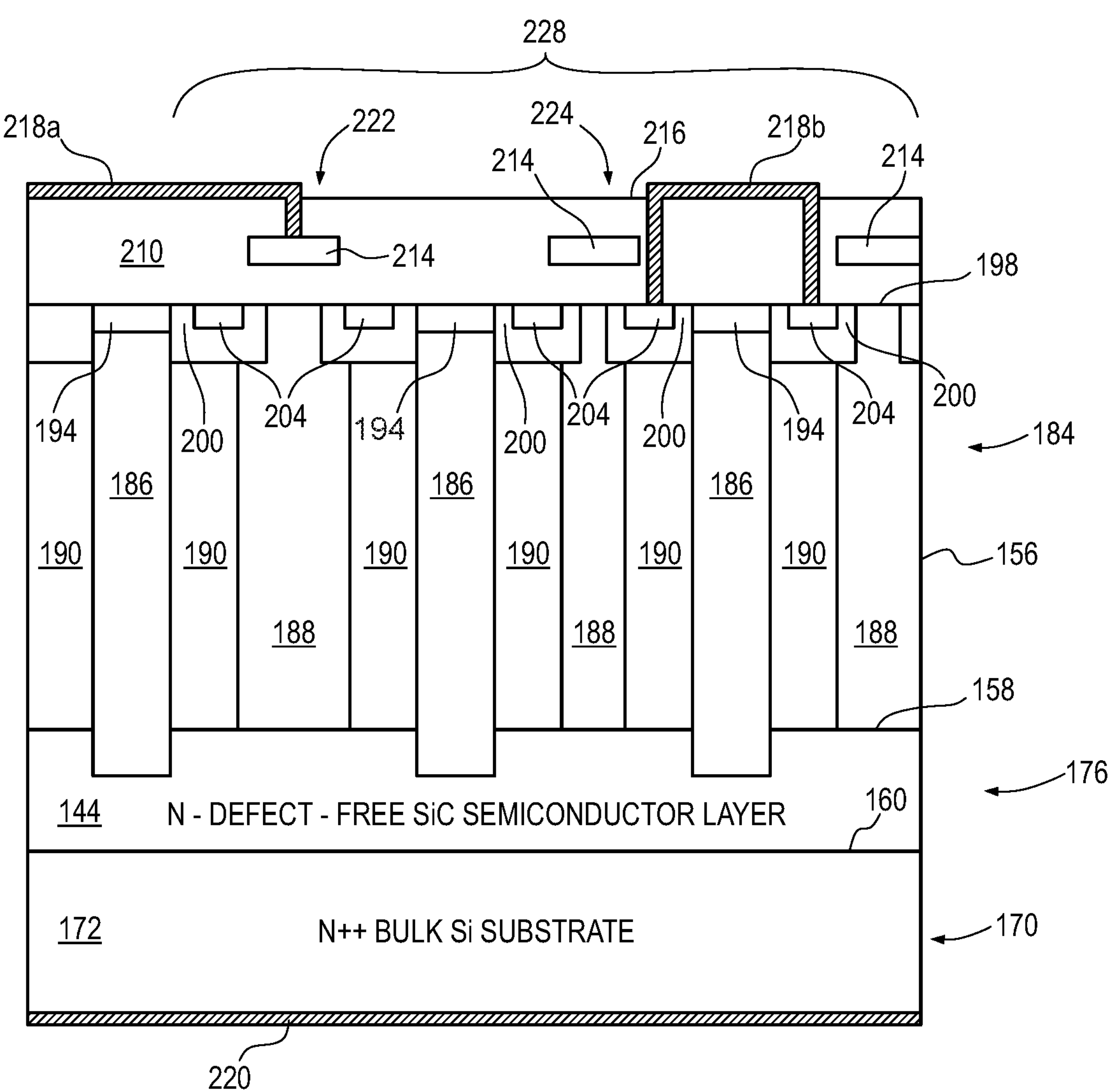
FIG. 9 illustrates a high-breakdown voltage power MOSFET cell formed on the substantially defect-free SiC substrate.

FIG. 9 shows high voltage power MOSFET 184 formed in semiconductor device layer 156. Trenches 186 are formed through semiconductor layer 156 and extending past surface 158 into semiconductor layer 144. Trenches 186 can be formed by deep reactive ion etching (DRIE) with a width of 3 μm and depth of 60-70 μm. The DRIE is a highly anisotropic etch process used to create deep penetration, steep-sided holes, cavities, and trenches in wafers/substrates, typically with high aspect ratios. DRIE utilizes an ionized gas or plasma, such as sulfur hexafluoride ($SF_6$), to remove material from semiconductor layer 156. DRIE technology permits deeper trenches 186 with straighter sidewalls. To create deep anisotropic etching of silicon, the etch process switches between different plasma chemistries to provide fluorine-based etching of the silicon while protecting the sidewall of the growing feature with a fluorocarbon layer. A $C_4F_8$ plasma deposits a fluoropolymer passivation layer onto the mask and into the etched feature. A bias from the platen causes directional ion bombardment resulting in removal of the fluoropolymer from the base of the feature and the mask. The fluorine free radicals in the $SF_6$ plasma etch the exposed silicon at the base of the etch feature isotropically. The DRIE process repeats multiple times to achieve a vertical etch profile for trenches 186. Alternatively, trenches 186 can be formed by laser direct ablation (LDA), plasma etching, reactive ion etching (RIE), sputter etching, vapor phase etching, and chemical etching. The sidewalls of each trench 186 can be smoothed using an isotropic plasma etch and may be used to remove a thin layer of silicon, e.g., 100-1000 Angstroms (A) from the trench sidewalls.

The sidewalls of trenches 186 are implanted or doped with a dopant, which may occur at predetermined angles. The dopant can be n-type material or p-type material, depending on the type of semiconductor device being made.

MOSFET 184 can be an n-channel device (N-MOS) or a p-channel device (P-MOS), where “p” denotes a positive carrier type (hole) and “n” denotes a negative carrier type (electron). Although the present embodiment is described in terms of an N-MOS device, the opposite type semiconductor material can be used to form a P-MOS device.

In various implantation steps described herein, the doping is performed by ion implantation, solid diffusion, liquid diffusion, spin-on deposits, plasma doping, vapor phase doping, laser doping, or the like. Doping with boron (B), aluminum (Al), or gallium (Ga) results in a more p-type region, and doping with phosphorus (P), antimony (Sb), or arsenic (As) impurities results in n-type region 188. Other dopants may be utilized, such as bismuth (Bi) and indium (In), depending on the material of the substrate and the desired strength of the doping.

The implantation angles are determined by the width of trenches 186 and the desired doping depth and is typically from about 2° to 12° from vertical. The implant is done at angles so that the bottom of each trench 186 is not implanted. The implant is performed at an energy level of about 30-200 kilo-electron-Volts (KeV) with dose of about 2e15 atoms/$cm^3$. Following implanting, a drive-in step at a temperature of up to 1200° C. may be performed for up to 12 hours.

The sidewalls of trenches 186 are implanted with a p-type dopant, such as boron, aluminum, or gallium impurities, with a dose of about 1e16 atoms/$cm^3$ to form p regions 190 with a width of about 1 μm. The p-implant leaves columns of n region 188 and columns of p region 190. The columns of n region 188 have equal and opposite charge as the columns of p region 190. The p-implants can be performed sequentially or simultaneously. The n-type dopant and p-type dopant drive-in may occur after each implantation step, or simultaneously with the implant.

An insulating material 194 is deposited in trenches 186. In one embodiment, insulating material 194 completely fills trenches 186. Alternatively, insulating material 194 is formed over trench 186 using a MEMS layer transfer or layer bonding process to form a cap over the trench, as it is not necessary to completely fill trenches 186 with insulating material. Using the layer transfer process to cap trench 186, there is no need to fill the trench with any material. Insulating material 194 can be polysilicon, re-crystallized polysilicon, single crystal silicon, or semi-insulating polycrystalline silicon (SIPOS). In one embodiment, insulating material 194 is SIPOS deposited into trenches 186 using a spun-on-glass (SOG) technique. The amount of oxygen content in the SIPOS is chosen to be between 2% and 80% to improve the electrical characteristics of the active region. Increasing the amount of oxygen content is desirable for electrical characteristics but varying the oxygen content also results in altered material properties. Higher oxygen content SIPOS thermally expands and contracts differently from the surrounding silicon which may lead to undesirable fracturing or cracking, especially in proximity to the interface of differing materials. Accordingly, the oxygen content of the SIPOS is optimally selected to achieve the most desirable electrical characteristics without an undesirable impact on mechanical properties.

Insulating material 194 can also be deposited in trenches 186 using other techniques, such as LPCVD, TEOS, or other suitable oxide deposition process. Insulating material 194 can be deposited in trenches 186 by a reflow process. After depositing insulating material 194, surface 198 of semiconductor layer 156 is planarized with a grinder or CMP.

A p-type dopant, such as boron, aluminum, or gallium impurities, is implanted to form p body regions 200 proximate to surface 198 of semiconductor layer 156. In the case of ion implantation of the p-type dopant into n region 188 and p regions 190, one embodiment can utilize an energy level of about 30-1000 KeV with a dose of 1e17 atoms/$cm^3$, followed by a high temperature drive-in step, e.g., a diffusion. Other implants can be deposited at appropriate dosages and energy levels. P body regions 200 can be formed at least partially by performing ion implantation of the sidewalls of trenches 186, prior to depositing insulating material 194 into the trenches. P body regions 200 operate as inversion layers to provide conduction channels through the semiconductor device.

Source regions 204 are formed within p body regions 200 proximate to surface 198. Source regions 204 are heavily doped n+ type regions, formed similar to p body regions 200. The orientation of source regions 204 with respect to p body regions 200 can be varied depending upon the configuration of MOSFET 184.

An interlayer dielectric or insulating layer 210 and gate regions 214 are formed over surface 198 of semiconductor layer 156. Gate regions 214 can be metal, doped polysilicon, amorphous silicon, or a combination thereof. In one embodiment, a first portion of insulating layer 210 is formed. Insulating layer 210 contains one or more layers of silicon dioxide ($SiO_2$), silicon nitride (Si3N4), silicon oxynitride (SiON), tantalum pentoxide ($Ta_2O_5$), aluminum oxide ($Al_2O_3$), polyimide, benzocyclobutene (BCB), polybenzoxazoles (PBO), or other suitable dielectric material. Insulating layer 210 is formed using PVD, CVD, screen printing, spin coating, spray coating, sintering, or thermal oxidation. Gate regions 214 are formed over the first portion of insulating layer 210. A second portion of interlayer dielectric or insulating layer 210 is formed over the first portion of the insulating layer and gate regions 214 to cover the gate regions. Surface 216 of insulating layer 210 can then be planarized and/or polished. In some embodiments, the first portion of insulating layer 210 can be used as a mask to form source regions 214.

A plurality of vias is formed through insulating layer 210 to source regions 204 and gate regions 214. The vias are filled with conductive material and connect to conductive layers **218*a* and 218*b*. Conductive layers 218*a* and 218*b* can be one or more layers of Al, Cu, Sn, Ni, Au, Ag, or other suitable electrically conductive material formed using patterning with PVD, CVD, sputtering, electrolytic plating, electroless plating process, or other suitable metal deposition process. Conductive layer 218*a* makes electrical contact to gate region 214, and conductive layer 218*b* makes electrical contact to source regions 204. Conductive layers 218*a* and 218*b* can be electrically isolated or electrically common depending on the configuration and operation of MOSFET 184. As a vertical device, the drain of MOSFET 184 is provided by n region 156 (n drift region) and n-type engineered substrate 176. Current flow path includes conductive layer 218*b*, source regions 120, the channel below gate region 214, and the n-type layers of engineered substrate 176 to the backside drain contact 220**.

MOSFET 184 is a multi-cell vertical power MOSFET having applications in AC-DC and DC-DC power converters, aerospace, and general purpose portable electronic devices. FIG. 9 illustrates two cells 222 and 224 in active region 228. The MOSFET cells are electrically connected in parallel to form a power MOSFET for high current carrying capacity. Engineered substrate 176 represents a WBG engineered drain that enhances the device breakdown voltage to 1200V and reduces $R_{DSON}$. Near defect-free SiC semiconductor layer 144 provides **600*v* of the device breakdown voltage and Si device layer 156** provides another 600 v of the device breakdown voltage to achieve the desired 1200 v.

The structure of MOSFET 184 has a feature size that is scalable to reduce cell size and provide a higher cell density, which increases the number of cells in the MOSFET and reduces $RDS_{ON}$ to about 90 milliohms at maximum drain current $I_D$ of 40 amperes. The semiconductor structure between surface 158 and surface 198 substantially represent a super-junction semiconductor device. Power MOSFET 184 can sustain 1200 v blocking, 600 v from near defect-free semiconductor layer 144 and **600*v* from device layer 156, while delivering low Rdson of 90 milliohms at ID max=40 A. The high-breakdown voltage characteristics of FIG. 9** can be applied to an IGBT, CTIGBT, thyristor, diode, and other MOS gated devices.

By leveraging the inherent benefits of MEMS manufacturing techniques and embedding SiC into the drain of the SJMOS structure, a new approach to the design and manufacture of robust radiation hard processes provides suitable for the deep space environment. The early superjunction products demonstrated a substantial competitive advantage with respect to Rdson*area product that allows for a 5× improvement over standard planar MOSFETs. Embedding SiC into the drain has the potential to improve device parametric performance by another 5× plus enhances radiation hardness to meet SEGR performance for 1200 V devices. The merger of SJMOS structures-MEMS manufacturing techniques-WBG material creates a new class of merged power semiconductor devices that in this case have the potential to sustain 1200 V blocking with no heavy-ion-induced permanent destructive effects upon exposure to high energy radiation of 87 Mev-$cm^2$/mg while delivering Rdson of 90 milliohms at ID max=40 A.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a structured substrate consisting essentially of a first semiconductor material and a patterned structure formed as a first surface of the structured substrate;

forming a sacrificial layer consisting essentially of a second semiconductor material dissimilar from the first semiconductor material, wherein the surface of the sacrificial layer contacts the first surface of the structured substrate;

forming a first semiconductor layer consisting essentially of the second semiconductor material dissimilar from the first semiconductor material over the surface of the sacrificial layer with defects induced from the dissimilar first semiconductor material and second semiconductor material being formed in the sacrificial layer by nature of the patterned structure;

removing the structured substrate and sacrificial layer leaving the first semiconductor layer substantially defect-free as the patterned structure removed defects;

forming a second semiconductor layer over the first semiconductor layer;

forming a trench through the second semiconductor layer and extending into the first semiconductor layer;

forming a first column of semiconductor material having a first conductivity type adjacent to the trench;

forming a second column of semiconductor material having a second conductivity type opposite the first conductivity type in contact with the first column of semiconductor material opposite the trench; and forming a source region over the first column of semiconductor material.

2. The method of claim 1, further including forming a compliant layer over a second surface of the structured substrate opposite the first surface of the structured substrate.

3. The method of claim 1, wherein the patterned structure includes forming an inverted pyramid structure over the first surface of the structured substrate.

4. The method of claim 1, wherein the first semiconductor material includes silicon and the second semiconductor material includes silicon carbide or cubic silicon carbide.

5. The method of claim 1, further including:

forming a second semiconductor layer over the first semiconductor layer; and forming an active electrical component in the second semiconductor layer.

6. The method of claim 1, further including forming a gate structure over the second semiconductor layer.

7. The method of claim 1, further including forming an insulating material cap over the trench without filling the trench.

8. A method of making a semiconductor device, comprising:

providing a structured substrate consisting essentially of a first semiconductor material and a patterned structure formed as a first surface of the structured substrate;

forming a sacrificial layer consisting essentially of a second semiconductor material dissimilar from the first semiconductor material, wherein the surface of the sacrificial layer contacts the first surface of the structured substrate;

forming a first semiconductor layer comprising the second semiconductor material in contact with the sacrificial layer;

removing the structured substrate and sacrificial layer leaving the first semiconductor layer substantially defect-free;

forming a second semiconductor layer over the first semiconductor layer; and forming an electrical component in the second semiconductor layer by, (a) forming a trench through the second semiconductor layer and extending into the first semiconductor layer, (b) forming a first column of semiconductor material having a first conductivity type adjacent to the trench, (c) forming a second column of semiconductor material having a second conductivity type opposite the first conductivity type in contact with the first column of semiconductor material opposite the trench, and (d) forming a source region over the first column of semiconductor material.

9. The method of claim 8, further including forming a compliant layer over a second surface of the structured substrate opposite the first semiconductor layer.

10. The method of claim 8, wherein the patterned structure includes forming an inverted pyramid structure over the first surface of the structured substrate.

11. The method of claim 8, wherein the first semiconductor material includes silicon and the second semiconductor material includes silicon carbide or cubic silicon carbide.

12. The method of claim 8, wherein defects induced from the dissimilar first semiconductor material and second semiconductor material are formed in the sacrificial layer by nature of the patterned structure.

13. The method of claim 8, further including forming a gate structure over the second semiconductor layer.

14. The method of claim 8, further including forming an insulating material cap over the trench without filling the trench.

15. A method of making a semiconductor device, comprising:

providing a structured substrate consisting essentially of a first semiconductor material and a patterned structure formed as a first surface of the structured substrate;

forming a sacrificial layer comprising a second semiconductor material dissimilar from the first semiconductor material over the first surface of the structured substrate;

forming a first semiconductor layer comprising the second semiconductor material over the sacrificial layer, wherein the first semiconductor layer is substantially defect-free;

removing the structured substrate and sacrificial layer leaving the first semiconductor layer substantially defect-free;

forming a second semiconductor layer over the first semiconductor layer; and forming an electrical component in the second semiconductor layer by, (a) forming a trench through the second semiconductor layer and extending into the first semiconductor layer, (b) forming a first column of semiconductor material having a first conductivity type adjacent to the trench, (c) forming a second column of semiconductor material having a second conductivity type opposite the first conductivity type in contact with the first column of semiconductor material opposite the trench, and (d) forming a source region over the first column of semiconductor material.

16. The method of claim 15, wherein the first semiconductor material is dissimilar from the second semiconductor material.

17. The method of claim 15, further including forming a compliant layer over a second surface of the structured substrate opposite the first surface of the structured substrate.

18. The method of claim 15, wherein the patterned structure includes forming an inverted pyramid structure over the first surface of the structured substrate.

19. The method of claim 15, wherein the first semiconductor material includes silicon and the second semiconductor material includes silicon carbide or cubic silicon carbide.

20. The method of claim 16, wherein defects induced from the dissimilar first semiconductor material and second semiconductor material are formed in the sacrificial layer by nature of the patterned structure.

21. The method of claim 15, further including forming a gate structure over the second semiconductor layer.

22. The method of claim 15, further including forming an insulating material cap over the trench without filling the trench.

* * * * *